United States Patent [19]

Nishigai et al.

[11] Patent Number: 5,094,574
[45] Date of Patent: Mar. 10, 1992

[54] SPOT FACING METHOD AND APPARATUS FOR PRINTED CIRCUIT BOARD

[75] Inventors: Masao Nishigai, Ayase; Tamio Otani, Hadano; Yasuhiko Kanaya, Machida, all of Japan

[73] Assignee: Hitachi Seiko Ltd., Ebina, Japan

[21] Appl. No.: 585,972

[22] Filed: Sep. 21, 1990

[30] Foreign Application Priority Data

Mar. 31, 1989 [JP] Japan .................................. 1-078282

[51] Int. Cl.$^5$ ...................... B23Q 15/24; B23Q 15/06
[52] U.S. Cl. ................................. 409/132; 408/1 R; 408/10; 408/12; 409/188; 409/195; 409/218
[58] Field of Search ......................... 408/1 R, 10-13, 408/16, 116; 409/186-188, 193-195, 218, 132

[56] References Cited

U.S. PATENT DOCUMENTS

| | | | |
|---|---|---|---|
| 3,995,969 | 12/1976 | Fleming | 408/12 |
| 4,765,784 | 8/1988 | Karwan | 408/13 |
| 4,784,541 | 11/1988 | Umehara et al. | 408/10 X |
| 4,865,494 | 9/1989 | Gudow | 408/11 X |
| 4,920,495 | 4/1990 | Pilkington | 364/474.37 |

FOREIGN PATENT DOCUMENTS 131804 6/1986 Japan .
200902 8/1988 Japan .

Primary Examiner—Steven C. Bishop
Attorney, Agent, or Firm—Antonelli, Terry, Stout & Kraus

[57] ABSTRACT

A spot facing method and apparatus for processing a printed circuit board incorporates a sensing device having a sensor probe capable of sensing the level of the surface of a printed circuit board, another sensing device for sensing the position of the end of a tool, measuring circuits for measuring the distance between the sensing probe and the end of the tool and the distance between the surface of the printed circuit board and the end of the tool in accordance with the signals from the sensing devices, and a controller connected to the measuring circuits so as to control the feed of the tool thereby attaining a high dimensional precision in the depthwise direction in the spot facing.

4 Claims, 2 Drawing Sheets

SPOT FACING METHOD AND APPARATUS FOR PRINTED CIRCUIT BOARD

BACKGROUND OF THE INVENTION

1. Field of the Invention

The present invention relates to a spot facing method and apparatus for processing a printed circuit board and, more particularly, to a spot facing method and apparatus suitable for achieving high dimensional precision in a depthwise direction.

2. Description of the Related Art

In recent years, there is a trend for multi-layered printed circuit boards to cope with demands for higher densities of packaging of wirings and components. The multi-layered structure essentially requires boring of holes which partly penetrate the multi-layered structure to provide electrical connections between adjacent layers, as well as spot facing in order to form recesses where electronic parts such as ICs are to be placed. Such boring and spot facing require a very high dimensional precision in the depthwise direction of, for example not greater than ± 0.05 mm.

Japanese Patent Unexamined Publication No. 61-131804 discloses a boring or spot facing method which can meet such a requirement. According to this method, it is possible to accurately form a hole down to a circuit on an internal layer, provided that a portion of the circuit is exposed at one end surface of the printed circuit board.

This method, however, cannot be used when the internal circuit is not exposed at the end surface of the printed circuit board or when the processing has to be done to an intermediate portion of an insulating layer.

The printed circuit board, which is composed of a plurality of layers of different materials bonded together, generally exhibits undulation or unevenness in thickness. In addition, since the position of a tool with respect to the spindle varies according to the type of the tool, it is impossible to conduct the processing by previously setting the amount of movement of the tool when a high processing accuracy is required.

SUMMARY OF THE INVENTION

Accordingly, an object of the present invention is to provide a spot facing method and apparatus which can perform spot facing with a high degree of precision in the depthwise direction.

To this end, according to the present invention an apparatus is provided which comprises: first sensing means for sensing the position of the end of a tool, second sensing means having a sensor probe capable of sensing the level of the surface of a printed circuit board, measuring circuits for measuring the distance between the sensing probe and the end of the tool and the distance between the surface of the printed circuit board and the end of the tool in accordance with the signals from the first and second sensing means, and a controller connected to the measuring circuits.

Thus, according to the invention, the position of the surface of the printed circuit board is detected by a sensor probe. The distance A between the sensor probe and the edge of the tool is detected in the state in which the sensor probe is out of contact with the surface of the printed circuit board. Then, the tool and the sensor probe are moved so that the sensor probe is brought into contact with the surface of the printed circuit board, thereby causing a relative movement between the sensor probe and the tool. The amount B of the relative movement is then measured. The distance C is then determined from the distance A and the amount B of the relative movement, and an amount of feed of the tool is determined on the basis of the distance C and the predetermined processing depth ZF. The feed of the tool is then controlled in accordance with the feed amount, thereby processing the printed circuit board.

DESCRIPTION OF THE PREFERRED EMBODIMENTS

Figure 1:
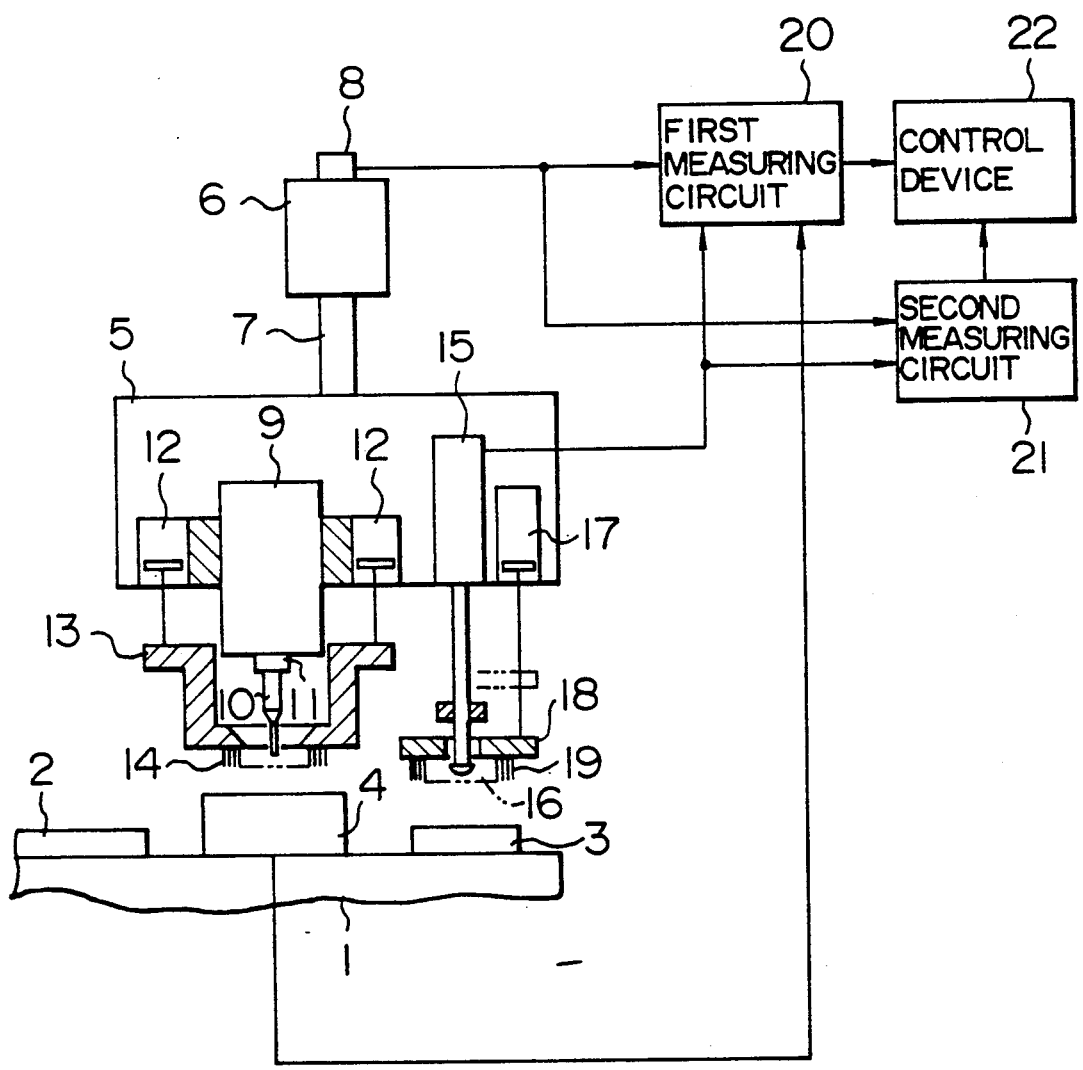
FIG. 1 is a schematic partial cross-sectional view of a printed circuit board processing apparatus embodying the present invention.

Referring to the drawings, a printed circuit board 2 is mounted on and fixed to a table 1 of the printed circuit board processing apparatus, with a block 3 being fixed to the table 1.

Figure 2:
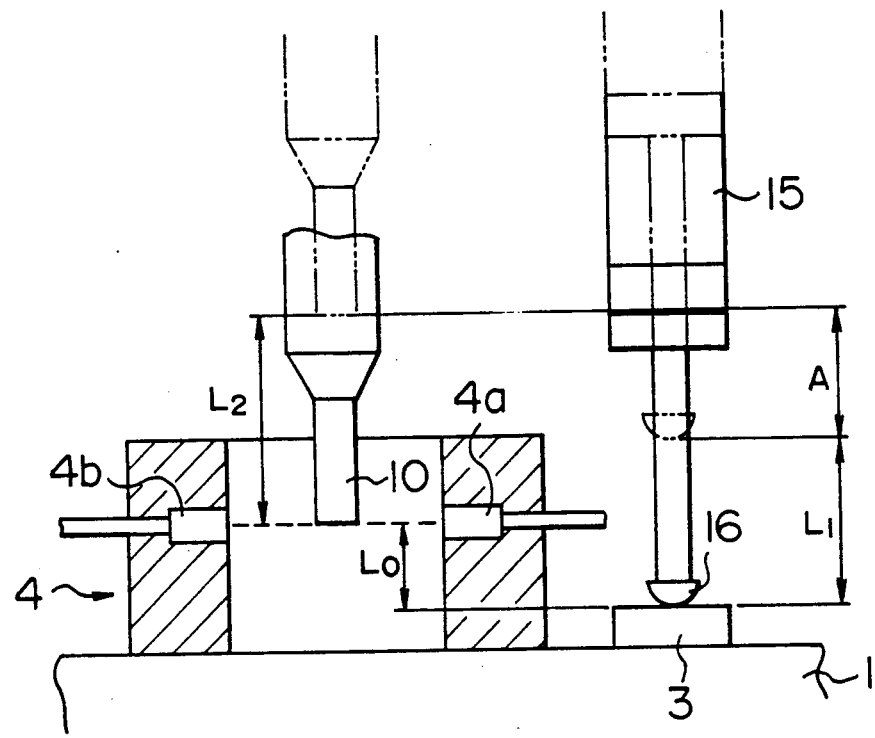
FIG. 2 is a schematic partial cross-sectional view of one position of components of the printed circuit board processing apparatus of FIG. 1.
Figure 3:
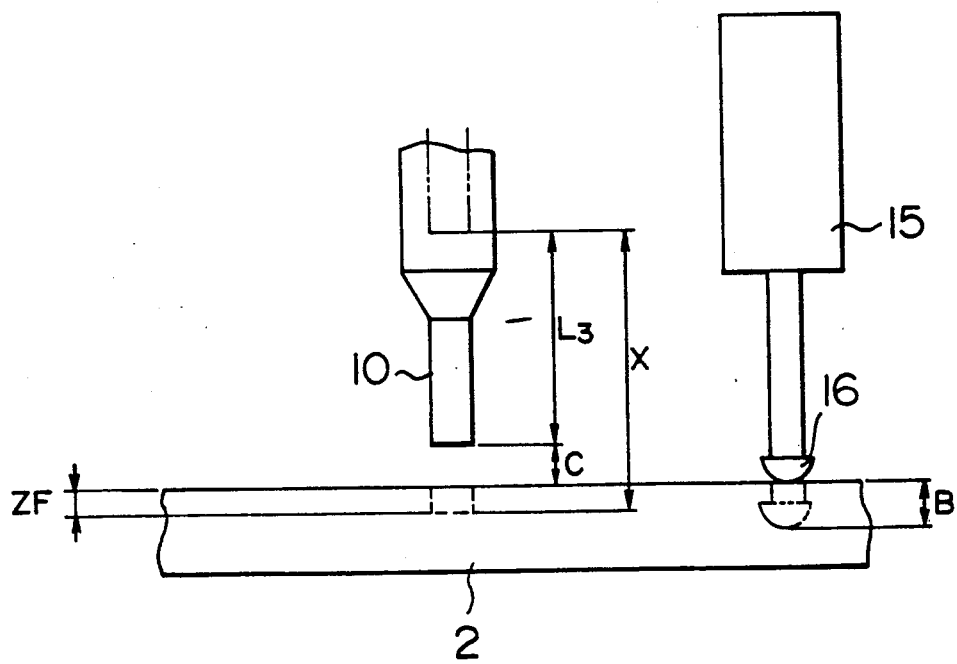
FIG. 3 is a schematic partial cross-sectional view of another position of components of the printed circuit board processing apparatus of FIG. 1.

A first sensing means 4 is fixed to the table 1 so as to be spaced from the block 3 by a predetermined distance and, as shown in FIG. 2, the sensing means 4 includes a light-projecting element 4a and a light-receiving element 4b.

A saddle 5 is supported by a slider (not shown) movable in a plane parallel to the table 1, so as to be movable in directions perpendicular to the table 1. A motor 6 is supported by the slider, and a feed screw 7 rotatably supported by the slider and,, has one end connected to the motor 6. This feed screw 7 is threadably engaged with a nut (not shown) fixed to the rear surface of the saddle 5. A rotary encoder 8 is provided on the motor 6. A spindle 9, fixed to the saddle 5, is provided therein with a rotary shaft (not shown) and a motor (not shown) for driving the rotary shaft. The rotary shaft is provided with a chuck 11 for holding a tool 10. A cylinder 12 is fixed to and supported by the saddle 5. A pressure foot 13 movably engages the spindle 9 and is supported by the rod of the cylinder 12. A brush 14 is mounted on the pressure foot 13.

A second sensing means 15 is carried by the saddle 5 at a predetermined distance from the spindle 9. A sensor probe 16 is movably carried by the sensing means 15.

A cylinder 17 is fixed to the saddle 5, with a bracket 18 being fixed to the rod of the cylinder 17. A brush 19 is provided on the bracket 18.

A first measuring circuit 20 is connected to the rotary encoder 8, the first sensing means 4 and the second sensing means 15.

A second measuring circuit 21 is connected to the rotary encoder 8 and the second sensing means 15.

A control device 22 is connected to the measuring circuits 20 and 21.

In operation, the distance $L_0$ between the upper surface of the block 3 and the sensing position of the sensing means 4 is previously measured and set in the measuring circuit 20.

Then, the tool 10 is chucked by the chuck 11 and a relative movement is caused between the table 1 and the saddle 5 so as to bring the tool 10 and the sensor probe 16 to positions where they respectively oppose the sensing means 4 and the block 3. Subsequently, the motor 6 is started to lower the saddle 5 so as to lower the tool 10 and the sensing means 15 until the tool 10 is sensed by the sensing means 4. Meanwhile, a counter in the measuring circuit 20 starts to count pulses supplied from the rotary encoder 8.

As a result, the sensor probe 16 of the sensing means abuts the block 3 so that further downward movement of the sensor probe 16 is stopped. Consequently, a relative movement is caused between the sensing means 15 and the sensor probe 16 so that sensing means 15 produces and transmits a contact signal indicative of the contact of the sensor probe 16 with the block 3.

The contact signal is received by the measuring circuit 20. Upon receipt of the contact signal, the measuring circuit 20 reads the number of the pulses counted by the counter and determines the amount $L_1$ of movement of the sensor probe 16. The counter, however, does not stop the counting but continues to count the pulses from the rotary encoder 8.

As a result of a further lowering of the saddle 5, the tool 10 and the sensing means 15 are lowered so that the tool 10 is inserted into the sensing means 4 so as to be sensed by the same. Consequently, the sensing means 4 produces and transmits a signal indicative of the fact that the end of the tool 10 has reached a predetermined position. At the same time, the motor is once stopped and then reversed to lift the saddle 5.

In response to the signal from the sensing means 4, the measuring circuit 20 reads the number of pulses counted by the counter so as to determine the amount $L_2$ of movement of the tool 10.

Meanwhile, the counter stops counting of the pulses delivered from the rotary encoder 8.

The measuring circuit 20 then determines the distance A between the end of the sensor probe 16 and the end of the tool 10 when the tool 10 is held on the chuck, on the basis of the aforementioned distance $L_0$, amount $L_1$ of movement of the sensing probe 16 and the amount $L_2$ of movement of the tool 10, by executing the following computation, and applies the distance A to the control device 22.

$$A = L_2 + L_0 - L_1 \quad (1)$$

After the determination of the distance A between the end of the tool 10 and the end of the sensor probe 16, a relative movement is caused between the table 1 and the saddle 5 so as to bring the sensor probe 16 to a position above the processing position for processing the printed circuit board 2. Then, the cylinder 17 is activated to lower the bracket 18 so as to set the brush 19 at a position below the sensor probe 16.

Then, the motor 6 is operated in accordance with instructions from the control device, so as to lower the tool 10 and the sensor probe 16 by a predetermined amount $L_3$. This amount $L_3$ of movement is determined to be large enough to bring the sensor probe 16 into contact with the printed circuit board 2 to enable the sensing means 15 to transmit the aforementioned signal but small enough to keep the tool 10 still away from the printed circuit board 2.

Consequently, the brush 19 contacts the printed circuit board 2 so as to press the printed circuit board 2 onto the table 1 with the same level of force as that exerted during processing. A further lowering of the sensing means 15 causes the sensor probe 16 to contact with the printed circuit board 2. Consequently, the measuring circuit 21 starts to operate so as to count the pulses delivered from the rotary encoder 8. When the motor 6 is stopped after the saddle 5 is lowered to a predetermined level, the measuring circuit 21 measures the amount B of the relative movement between the tool 10 and the sensor probe 16 on the basis of the number of pulses counted, and applies the results to the control device 22.

Meanwhile, the motor 6 is stopped once and then reversed to raise the saddle 5 relative to the table 1, so that the tool 10 is set to a position above the processing position.

The controller 22 determines the distance C between the surface of the printed circuit board 2 and the end of the tool 10 after the movement of the saddle 5 in an amount $L_3$, in accordance with the distance A and the amount B of relative movement, by executing the following computation.

$$C = A - B \quad (2)$$

The feeding amount X of the tool 10 necessary for the processing is calculated on the basis of the above-mentioned distance C, amount $L_3$ of movement and the preset processing depth ZF, by conducting the following computation:

$$X = L_3 + ZF + C \quad (3)$$

The motor 6 is activated in accordance with this feeding amount X so as to effect spot facing on the printed circuit board 2. More specifically, the saddle 5 is lowered to bring the brush 14 into contact with the printed circuit board 2 so that the printed circuit board 2 is pressed onto the table 1 with a force which is proportional to the pressure of the fluid supplied to the cylinder 12. Then, the tool 10 cuts into the printed circuit board 2 thereby spot-facing the printed circuit board 2.

According to the described method, it is possible to effect the spot facing with a high dimensional precision in the depthwise direction, without being influenced by unstable factors during the processing such as the thermal displacement of the printed circuit board processing machine, positional precision of the tool 10 with respect to the spindle 9, warp and undulation of the printed circuit board 2, and so forth.

In the embodiment described above, the measurement of the spot facing position is conducted only once. This, however, is not exclusive. For example, the invention may be carried out such that the distance C between the end of the tool 10 and the surface of the printed circuit board 2 is determined in accordance with the mean of values measured over a plurality of measuring points which are set within each spot-facing region. It is also possible to determine the distance C between the end of the tool 10 and the surface of the printed circuit board 2 on the basis of the mean of values measured over a plurality of measuring points distributed over the entire area of the printed circuit board 2.

The embodiment has been described on an assumption that the sensing position of the sensing means 4 is at a level which is different from the upper surface of the block 3. However, the sensing position of the sensing means 4 may be set at the same level as the upper surface of the block 3. In such a case, the distance A between the end of the tool 10 held on the chuck 11 and the end of the sensor probe 16 can be determined through the measurement of the amount of the relative movement between the sensor probe 16 and the tool 10.

As has been described, according to the present invention, the amount of feed of the tool is determined in accordance with the results of measurements of the position of the tool end and the position of the surface of the printed circuit board where the spot facing is to be conducted. It is therefore possible to effect the spot facing with a high dimensional precision in the direction of the depth of the hole to be formed.

What is claimed is:

1. A spot facing method for processing a printed circuit board comprising:

measuring a distance A between a sensor probe sensing a position of a surface of said printed circuit board and an end of an edge of a tool while said sensor probe is positioned away from said surface of said printed circuit board;

measuring an amount B of relative movement between said sensor probe and said tool when said tool is moved relative to said sensor probe after said sensor probe has contacted said printed circuit board, said relative movement being caused by moving said tool and said sensor probe in a direction of a processing depth by a predetermined amount L3 while disposing said sensor probe in a position opposite to a processing position for processing said printed circuit board and pressing said printed circuit board with the same level of force as that exerted during processing, said predetermined amount L3 being large enough to bring said sensor probe into contact with said printed circuit board but small enough to maintain said tool at a position away from said printed circuit board;

determining a distance C between the end of said tool and said surface of said printed circuit board when the amount B is obtained on the basis of said distance A and said amount B of relative movement;

determining an amount X of feed of said tool in said direction of the processing depth on the basis of said distance C, said predetermined amount L3 and a predetermined processing depth ZF;

disposing said tool in said position opposite to said processing position for processing said printed circuit board; and controlling the feed of said tool in accordance with said amount X of feed so as to perform a spot facing.

2. A spot facing method for processing a printed circuit board according to claim 1, wherein said distance C between said end of said tool and said surface of said printed circuit board is determined on the basis of the mean of values measured on a plurality of measuring points set on the region of the spot facing.

3. A spot facing method for processing a printed circuit board according to claim 1, wherein said distance C between said end of said tool and said surface of said printed circuit board is determined on the basis of the mean of values measured on a plurality of measuring points set over the entire area of said printed circuit board.

4. An apparatus for processing a printed circuit board of the type having a table for mounting said printed circuit board, a spindle for holding and rotating a tool, and a saddle for supporting said spindle, said apparatus comprising: first sensing means attached to said table and capable of sensing arrival of said tool; second sensing means attached to said saddle and having a movable sensor probe projecting beyond the end of said tool towards said table; rotation detecting means associated with driving means for moving said saddle; a first measuring circuit connected to said first and second sensing means and said rotation detecting means and capable of measuring the amount of movement of said saddle in the period between the moment at which said second sensing means is operated and a moment at which said first sensing means operates; a second measuring circuit connected to said second sensing means and said rotation detecting means and capable of measuring the amount of movement of said saddle after the start of operation of said second sensing means; and a controller connected to said first and second measuring circuits, and capable of determining the amount of feed of said tool on the basis of the measured values derived from the respective measuring circuits and a predetermined depth of processing and controlling the feed of said tool on the basis of the amount of feed.

* * * * *